(12) United States Patent
Hwang et al.

(10) Patent No.: US 7,879,736 B2
(45) Date of Patent: Feb. 1, 2011

(54) COMPOSITION FOR ETCHING SILICON OXIDE AND METHOD OF FORMING A CONTACT HOLE USING THE SAME

(75) Inventors: Dong-Won Hwang, Gyeonggi-do (KR); Kook-Joo Kim, Seoul (KR); Jung-In La, Chungcheongnam-do (KR); Pil-Kwon Jun, Gyeonggi-do (KR); Seung-Ki Chae, Seoul (KR); Yang-Koo Lee, Gyeonggi-do (KR)

(73) Assignees: Samsung Electronics Co., Ltd., Gyeonggi-do (KR); Cheil Industries, Inc., Gyeonggi-do (KR)

( * ) Notice: Subject to any disclaimer, the term of this patent is extended or adjusted under 35 U.S.C. 154(b) by 780 days.

(21) Appl. No.: 11/771,896

(22) Filed: Jun. 29, 2007

(65) Prior Publication Data

US 2008/0121622 A1    May 29, 2008

(30) Foreign Application Priority Data

Jun. 29, 2006    (KR) ............... 10-2006-0059054

(51) Int. Cl.
*H01L 21/302* (2006.01)
*H01L 21/461* (2006.01)

(52) U.S. Cl. .................. 438/756; 216/97; 216/99; 216/109

(58) Field of Classification Search ............. 216/109, 216/97, 99, 101, 108; 438/756, 755
See application file for complete search history.

(56) References Cited

U.S. PATENT DOCUMENTS 3,699,211 A * 10/1972 Schimitschek et al. ...... 423/263
7,192,860 B2 * 3/2007 McFarland et al. .......... 438/612

FOREIGN PATENT DOCUMENTS

| JP | 2000-164585 | 6/2000 |
| JP | 2001-332527 | 11/2001 |
| JP | 2004-277576 | 10/2004 |

OTHER PUBLICATIONS

English language abstract of Japanese Publication No. 2000-164585.
English language abstract of Japanese Publication No. 2001-332527.
English language abstract of Japanese Publication No. 2004-277576.

* cited by examiner

*Primary Examiner*—Roberts Culbert
(74) *Attorney, Agent, or Firm*—Harness, Dickey & Pierce, P.L.C.

(57) ABSTRACT

In a composition for etching silicon oxide, and a method of forming a contact hole using the composition, the composition which includes from about 0.01 to about 2 percent by weight of ammonium bifluoride, from about 2 to about 35 percent by weight of an organic acid, from about 0.05 to about 1 percent by weight of an inorganic acid, and a remainder of a low polar organic solvent. The composition may reduce damages to a metal silicide pattern that may be exposed in an etching process performed for forming the contact hole.

12 Claims, 13 Drawing Sheets

COMPOSITION FOR ETCHING SILICON OXIDE AND METHOD OF FORMING A CONTACT HOLE USING THE SAME

CROSS-REFERENCE TO RELATED APPLICATION

This application claims priority under 35 U.S.C. §119 to Korean Patent Application No. 2006-59054, filed on Jun. 29, 2006, the contents of which are herein incorporated by reference in their entireties.

BACKGROUND OF THE INVENTION

Embodiments of the present invention relate to a composition for etching silicon oxide and a method of forming a contact hole using the same. More particularly, in embodiments of the present invention relate to a composition for etching silicon oxide, which may be used for enlarging a hole formed in a silicon oxide layer and a method of forming a contact hole using the composition.

In order to proceed with a large quantity of information more rapidly, a semiconductor device having a high transmission rate of data is required. Accordingly, the integration degree of a cell included in the semiconductor device has increased, but a design rule of the wiring has decreased. As the design rule has been reduced, the wiring of the semiconductor device has been developed to have a three dimensional shape or a multi-layered structure. The integration degree of the semiconductor device is increased in reverse proportion to a gap between conductive patterns. It also increases in proportion to the occurrence probability of a misalignment of the conductive patterns during a photolithography process that may be performed for forming a contact hold through an insulation interlayer between the conductive patterns.

Furthermore, when the design rule of the wiring is decreased down to about 80 nm, the width of the contact hole which penetrates the insulation interlayer between conductive structures, such as a bit line, and exposes a contact pad which is also reduced greatly. As a result, an exposed area of the contact pad becomes very limited, and thus a contact margin between a contact plug formed in the contact hole and the contact pad may be insufficient.

The width of the contact hole may be enlarged by using an etching solution such as an LAL 200 solution including hydrofluoric acid and ammonium fluoride so as to obtain a sufficient contact margin between the contact plug for the capacitor and the contact pad.

However, the etching solution such as an LAL 200 solution employed for enlarging the contact hole has a high etching rate with respect to the metal silicide pattern included in the conductive structure. Therefore, as shown in a portion "C" in FIG. 1, excessive damage to the metal silicide pattern may be generated. When a nitride is deposited in the contact hole in a subsequent process, the nitride fills the damaged portion of the metal silicide, thereby causing an increase of resistance in the conductive structures such as a bit line.

SUMMARY OF THE INVENTION

Embodiments of the present invention provide a composition for etching silicon oxide that may reduce damages to metal silicide.

Embodiments of the present invention provide a method of forming a contact hole using the above-mentioned composition.

According to one aspect of the present invention, a composition and a method are provided for forming a contact hole. The method comprises preparing a substrate having a silicon oxide layer that covers conductive structures including a metal silicide pattern. In one embodiment, a first etching process may be performed on the silicon oxide layer to form a preliminary contact hole that exposes the substrate between the conductive structures with a first width. In another embodiment, a second etching process is performed on the silicon oxide layer using a composition to form a silicon oxide layer pattern having a contact hole that exposes the substrate between the conductive structures with a second width substantially greater than the first width.

In a further embodiment, the composition includes from about 0.01 to about 2 percent by weight of ammonium bifluoride ($NH_4HF_2$), from about 2 to about 35 percent by weight of an organic acid, from about 0.05 to about 1 percent by weight of an inorganic acid, and a remainder of a low polar organic solvent. In still a further embodiment, the composition may comprise from about 0.05 to about 1 percent by weight of ammonium bifluoride, from about 5 to about 30 percent by weight of the organic acid, from about 0.06 to about 0.5 percent by weight of the inorganic acid, and the remainder being the low polar organic solvent. In still another embodiment, the composition may comprise from about 0.1 to about 0.5 percent by weight of ammonium bifluoride, from about 10 to about 25 percent by weight of the organic acid, from about 0.08 to about 0.3 percent by weight of the inorganic acid, and the remainder being the low polar organic solvent.

In an embodiment of this invention, the silicon oxide layer may be formed to have a multi-layered structure sequentially including a BPSG layer and an HDP silicon oxide layer. In another embodiment, a thickness ratio between the BPSG layer and the HDP silicon oxide layer may be in a range of from about 1:2 to about 1:4. In a further embodiment, the contact hole may comprise a first contact hole having a first lower width formed through the HDP silicon oxide layer and a second contact hole having a second lower width formed through the BPSG layer, the second lower width being substantially greater than the first lower width. In still a further embodiment, the composition may have an etching selectivity between the HDP silicon oxide layer and the BPSG layer in a range of from about 1:1.2 to about 1:2.5.

In still another embodiment, the second etching process may be performed on the silicon oxide layer until a sidewall of the metal silicide pattern is exposed. In an alternative embodiment, the substrate may comprise a transistor including a first impurity region and a second impurity region, a first contact pad connected to the first impurity region and a second contact pad connected to the second impurity region.

In one embodiment, the inorganic acid may comprise at least one of hydrochloric acid (HCl), nitric acid ($HNO_3$), and sulfuric acid ($H_2SO_4$). In another embodiment, the organic acid may comprise at least one of acetic acid, formic acid and propionic acid. In a further embodiment the low polar organic solvent may comprise one of dimethylformamide, dimethyl sulfoxide, acetonitrile, tetrahydrofuran methyl ethyl ketone.

According to an example embodiment of the present invention, the composition for etching silicon oxide may be used for enlarging a lower width of a contact hole formed in a silicon oxide layer, and may also reduce damages to a metal silicide pattern of a conductive structure that may be exposed during the process for forming the contact hole. By suppressing damages to the metal silicide pattern of the conductive structure, a spacer may be properly formed on a sidewall of the conductive structure exposed by the contact hole, and an increase of an electrical resistance in the conductive structure may be reduced or prevented.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE INVENTION

Figure 1:
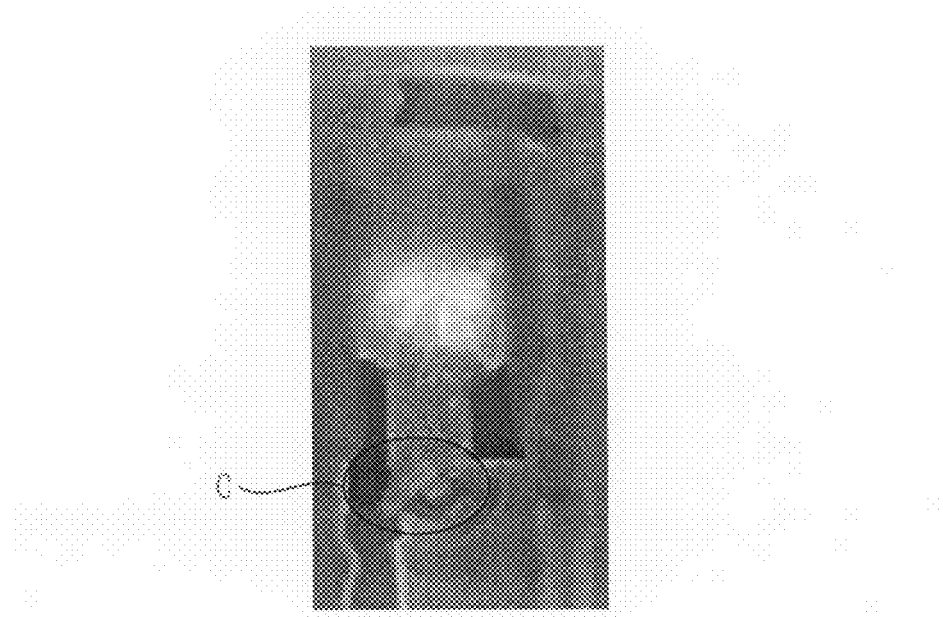
FIG. 1 is a picture showing a metal silicide pattern damaged in a process for enlarging a hole using an etching solution of LAL 200.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Etching Silicon Oxide

A composition for etching silicon oxide of the present invention may be used for enlarging a contact hole formed in a silicon oxide layer covering a metal silicide pattern. Particularly, the composition for etching silicon oxide may prevent or reduce damages to the metal silicide pattern exposed while enlarging the contact hole, and may also readily etch the silicon oxide layer. That is, the composition for etching silicon oxide may reduce or suppress damages to the metal silicide pattern and may effectively etch silicon oxide.

The composition for etching silicon oxide of the present invention includes ammonium bifluoride ($NH_4HF_2$), an inorganic acid, an organic acid and a low polar organic solvent. Particularly, the composition for etching silicon oxide may include from about 0.01 to about 2 percent by weight of ammonium bifluoride ($NH_4F.HF$), from about 0.05 to about 1 percent by weight of the inorganic acid, from about 2 to about 35 percent by weight of the organic acid, and a remainder of the low polar organic solvent.

The composition for etching silicon oxide may have various etching rates according to types of a silicon oxide layer to be etched. Examples of the silicon oxide layer may include a borophosphosilicate glass (BPSG) layer, a high density plasma (HDP) silicon oxide layer, a multi-layer thereof, etc. In according to an embodiment of the present invention, a multi-layer of a BPSG layer and a HDP silicon oxide layer may be used for the silicon oxide layer.

Ammonium bifluoride included in the composition for etching silicon oxide may etch the silicon oxide layer and reduce damages to the metal silicide pattern in an etching process performed for enlarging a contact hole.

In particular, as noted from a chemical formula of ammonium bifluoride ($NH_4F.HF$), ammonium bifluoride may comprise ammonium fluoride ($NH_4F$) and hydrofluoric acid (HF). Accordingly, the ammonium bifluoride may exist in a form of ionized ammonium fluoride and ionized hydrofluoric acid in the composition for etching silicon oxide. Ionized hydrofluoric acid may be an etching agent that may etch the silicon oxide layer exposed by the contact hole. Ionized ammonium fluoride may be a buffering agent that may reduce an etching rate of the silicon oxide layer and the metal silicide pattern in the process performed for enlarging a contact hole formed in the silicon oxide layer.

When the composition for etching silicon oxide includes less than about 0.01 percent by weight of ammonium bifluoride, the etching rate of the silicon oxide layer may be greatly reduced. In addition, when the composition for etching silicon oxide includes greater than about 2 percent by weight of ammonium bifluoride, the increased amount of hydrofluoric acid in the composition for etching silicon oxide may cause damages to the metal silicide pattern. Accordingly, the composition for etching silicon oxide in one embodiment includes from about 0.01 to about 2 percent by weight of ammonium bifluoride, preferably from about 0.05 to about 1 percent by weight of ammonium bifluoride, and more preferably from about 0.1 to about 0.5 percent by weight of ammonium bifluoride.

For example, an etching selectivity of the BPSG layer relative to the HDP silicon oxide layer may be changed in accordance with the amount of ammonium bifluoride included in the composition for etching silicon oxide. Particularly, as the amount of ammonium bifluoride increases, the etching selectivity of the BPSG layer relative to the HDP silicon oxide layer may decrease.

The organic acid may be used for improving a solubility of ammonium bifluoride in the composition for etching silicon oxide. Ammonium bifluoride may not be sufficiently dissolved in the low polar organic solvent, since ammonium bifluoride has a low solubility in the low polar organic solvent. Therefore, the composition for etching silicon oxide may be prepared by dissolving ammonium bifluoride in the organic acid, and then by mixing the dissolved ammonium bifluoride with the low polar organic solvent.

Examples of the organic acid that may be used for the composition for etching silicon oxide may be acetic acid, formic acid, propionic acid, etc. These may be used alone or in a mixture thereof. In accordance with an embodiment of the present invention, acetic acid may be used as the organic acid.

When the composition for etching silicon oxide includes less than about 2 percent by weight of the organic acid, ammonium fluoride may not be sufficiently dissolved in the composition for etching silicon oxide. When the composition for etching silicon oxide includes greater than about 35 percent by weight of the organic acid, the etching rate of the silicon oxide layer may be reduced and damage to the metal silicide pattern may be generated. A minimum amount of the organic acid may be preferably used for dissolving ammonium bifluoride. Therefore, in one embodiment, the composition for etching silicon oxide includes from about 2 to about 35 percent by weight of the organic acid, preferably from about 5 to about 30 percent by weight of the organic acid, and more preferably from about 10 to about 25 percent by weight of the organic acid.

For example, the organic acid may increase the etching selectivity of the BPSG layer with respect to the HDP silicon oxide layer. In other words, the organic acid may serve to selectively etch the BPSG layer relative to the HDP silicon oxide layer. However, as the degree of damage to the metal silicide pattern may be proportional to the amount of the organic acid, the amount of the organic acid may be properly adjusted according to the degree of damage to the metal silicide pattern and the etching selectivity, respectively.

The inorganic acid included in the silicon oxide layer may increase the etching selectivity of the BPSG layer with respect to the HDP silicon oxide layer. For example, when a relatively small amount of the organic acid is used in the subject composition, the inorganic acid may compensate for a reduction in the etching selectivity of the BPSG layer relative to the HDP silicon oxide layer.

When the composition for etching silicon oxide includes less than about 0.05 percent by weight of the inorganic acid, the composition for etching silicon oxide may have the etching selectivity of less than about 1:1.2 between the HDP silicon oxide layer and the BPSG layer. When the composition for etching silicon oxide includes greater than about 1 percent by weight of the inorganic acid, the etching selectivity of the BPSG layer with respect to the HDP silicon oxide layer may increase. However, damages to the metal silicide pattern may be generated. Accordingly, in an embodiment herein the composition for etching silicon oxide may include from about 0.05 to about 1 percent by weight of the inorganic acid, preferably from about 0.06 to about 0.5 percent by weight of the inorganic acid, and more preferably from about 0.08 to about 0.3 percent by weight of the inorganic acid.

Examples of the inorganic acid may include hydrochloric acid (HCl), nitric acid ($HNO_3$), sulfuric acid ($H_2SO_4$), etc. These inorganic acids may be used alone or in a mixture thereof. In accordance with an example embodiment of the present invention, nitric acid may be used for the inorganic acid.

The low polar organic solvent included in the composition for etching silicon oxide may prevent the metal silicide pattern from being etched. By adjusting the amount of each component, a constant concentration of each component can be maintained.

Examples of the low polar organic solvent may include dimethylformamide, dimethyl sulfoxide, acetonitrile, tetrahydrofuran, methyl ethyl ketone, etc. These may be used alone or in a mixture thereof. In accordance with an example embodiment of the present invention, acetonitrile may be used for the low polar organic solvent.

In an embodiment of the present invention, the composition for etching silicon oxide may reduce or suppress damage to the metal silicide pattern from occurring and may also have the etching selectivity in a range of from about 1:1.2 to about 1:2.5, and preferably from about 1:1.5 to about 1:2.0 between the HDP silicon oxide layer and the BPSG layer.

The composition for etching silicon oxide including the above-mentioned components may be employed for etching the silicon oxide layer used for manufacturing a semiconductor device such as a DRAM, an SRAM, a flash memory, etc. Particularly, the composition for etching silicon oxide may be used for enlarging a lower width of the contact hole formed in a silicon oxide layer and also suppress damages to the metal silicide pattern.

A method of forming a contact hole using the above-mentioned composition for etching silicon oxide will be fully described hereinafter.

Figure 2:
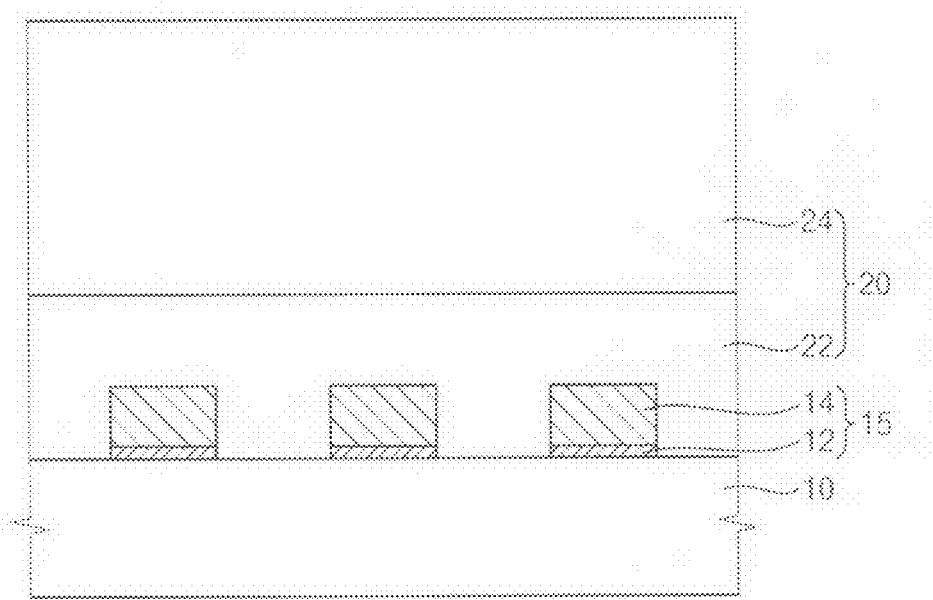
FIGS. 2 to 4 are cross-sectional views illustrating a method of forming a contact hole using a composition for etching silicon oxide in accordance with an embodiment of the present invention.

Referring to FIG. 2, a substrate 10, on which a silicon oxide layer 20 covering at least one conductive structure 15 including a metal silicide pattern 12 is formed, is prepared.

Particularly, the conductive structure 15 including the metal silicide pattern 12 and a conductive pattern 14 is formed on the substrate 10. The conductive structures 15 may be spaced apart from each other on the substrate 10. For example, the conductive structures 15 may be spaced apart from one another by the same distance (as shown) or by a different distance. Examples of the substrate 10 may include a silicon substrate or a silicon substrate including a transistor and/or a contact wiring.

The silicon oxide layer 20 is formed on the substrate 10 to cover the conductive structure 15. The silicon oxide layer 20 may be formed to have a multi-layered structure of silicon oxides having different etching selectivities. In an embodiment of the present invention, the silicon oxide layer 20 may be formed having a double-layered structure sequentially including a BPSG layer 22 and an HDP silicon oxide layer 24. For example, the BPSG layer 22 and the HDP silicon oxide layer 24 may have a thickness ratio of from about 1:2 to about 1:4.

Figure 3:
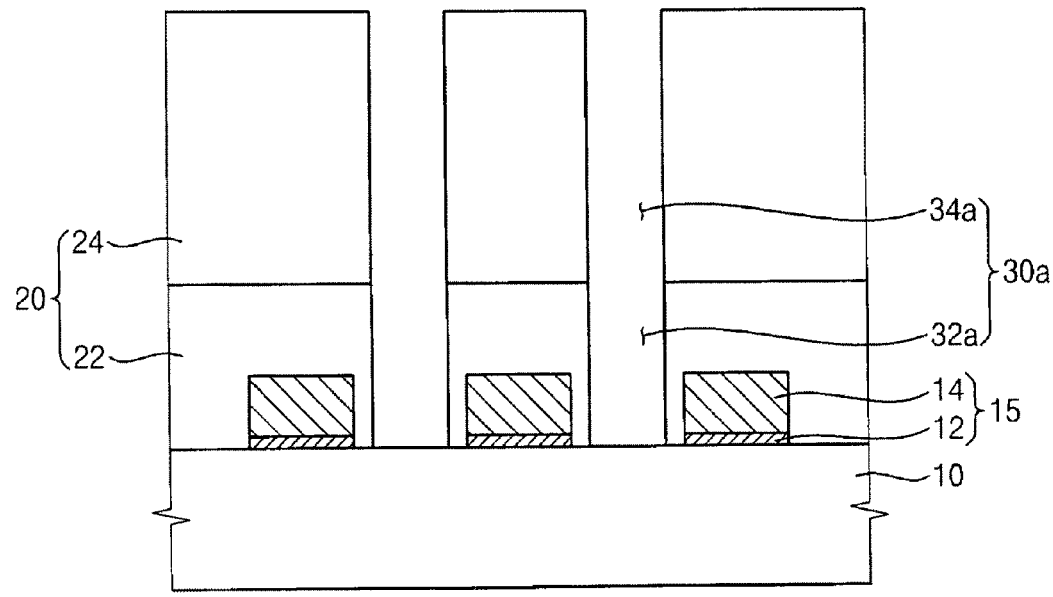

Referring to FIG. 3, a first etching process is performed on the silicon oxide layer 20 to form a preliminary contact hole 30a exposing the substrate 10 adjacent to the conductive structure 15 with a first width.

In order to form the preliminary contact hole 30a, an etching mask (not shown) may be formed on the silicon oxide layer 20. The etching mask may include a first photoresist pattern or a hard mask, and may define a region in which the preliminary contact hole 30a will be formed.

A dry etching process may be performed on the silicon oxide layer 20 using the etching mask. As a result, the preliminary contact hole 30a is formed through the silicon oxide layer 20 to expose the substrate 10 with the first width. The preliminary contact hole 30a may include a first preliminary contact hole 34a formed through the HDP silicon oxide layer 24 and a second preliminary contact hole 32a formed through the BPSG layer 22. In an embodiment of the present invention, a width of the first preliminary contact hole 34a may be substantially equal to or narrower or wider than a width of the second preliminary contact hole 32a.

Figure 4:
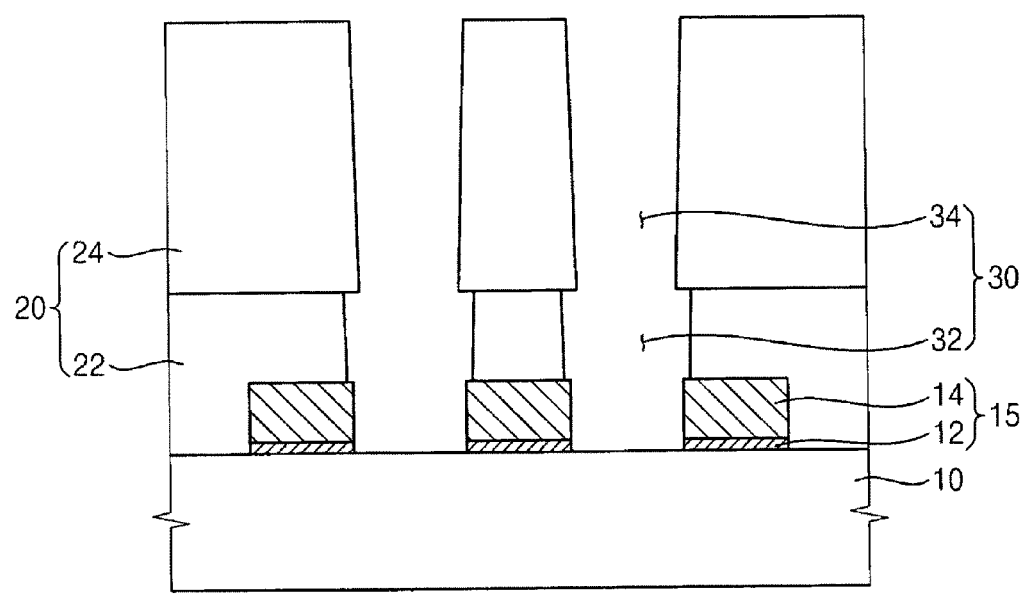

Referring to FIG. 4, a second etching process is performed on the silicon oxide layer 20 having the preliminary contact hole 30a using a composition for etching silicon oxide in accordance with an example embodiment of the present invention. For example, the second etching process may be performed until a sidewall of the metal silicide pattern 12 of the conductive structure 15 is exposed. As a result, a contact hole 30 is formed through the silicon oxide layer 20 to expose the substrate 10 with a second width substantially wider than the first width. The contact hole 30 includes a first contact hole 34 formed through the HDP silicon oxide layer 24 and a second contact hole 32 formed through the BPSG layer 22. In one embodiment, a width of the second contact hole 32 may be substantially wider than a width of the first contact hole 34. Additionally, the contact hole 30 may be formed by the second etching process to have a sidewall of a reverse stepped profile. In an embodiment, the stepped profile is formed because the composition for etching silicon oxide may have an etching selectivity between the HDP oxide layer 24 and the BPSG layer 22 in a range of from about 1:1.2 to about 1:2.5.

Although the metal silicide pattern 12 is exposed in the second etching process, the metal silicide pattern 12 may not be damaged by the composition for etching silicon oxide.

In a further embodiment, the composition for etching silicon oxide used for the second etching process includes from about 0.01 to about 2 percent by weight of ammonium bifluoride ($NH_4HF_2$), from about 2 to about 35 percent by weight of an organic acid, from about 0.05 to about 1 percent by weight of an inorganic acid, and a remainder of a low polar organic solvent. Particularly, ammonium bifluoride included in the composition may have a low solubility in the low polar organic solvent. Hence, ammonium bifluoride may be preferably used after being dissolved in the organic acid. That is, the composition for etching silicon oxide may be prepared by mixing the inorganic acid, the low polar organic solvent, and ammonium bifluoride that is dissolved in the organic acid.

Hereinafter, a method of manufacturing a semiconductor device using the composition for etching silicon oxide will be fully described.

Figure 5:
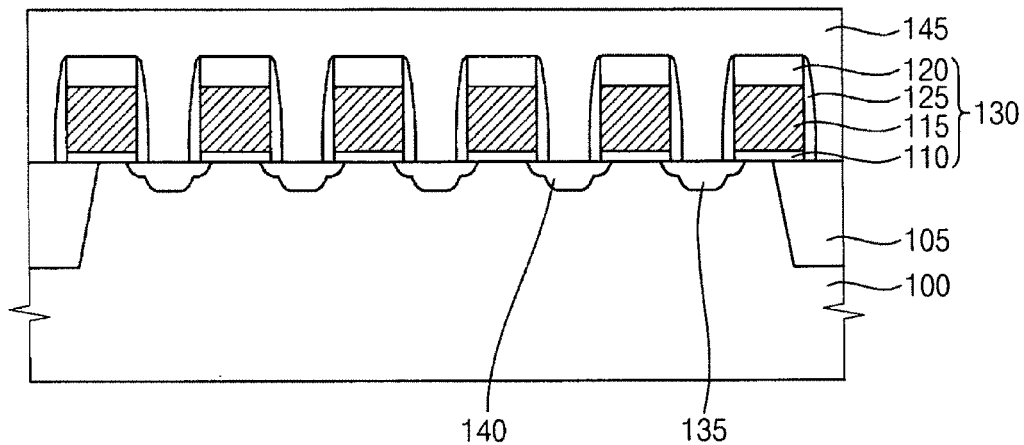
FIGS. 5 to 15 are cross-sectional views illustrating a method of manufacturing a semiconductor device in accordance with an embodiment of the present invention.

FIG. 5 is a cross-sectional view illustrating forming a transistor and a first insulation interlayer 145 on a substrate in accordance with an embodiment of the present invention.

Referring to FIG. 5, a shallow trench isolation (STI) process may be performed to form an isolation layer 105 on a substrate 100. As a result, the substrate 100 may be divided into an active region and a field region.

A gate insulation layer may be formed on the substrate 100 including the isolation layer 105 by a thermal oxidation process, a chemical vapor deposition (CVD) process or an atomic layer deposition (ALD) process. The gate insulation layer may be formed using silicon oxide or a high dielectric material that has a dielectric constant substantially higher than that of silicon oxide.

Examples of the high dielectric material that may be used for the gate insulation layer may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $Ve_2O_3$, $La_2O_3$, $Pr_2O_3$, $Sb_2O_3$, $Sb_2O_5$, $CaO$, etc. These may be used alone or in a combination thereof.

A first conductive layer and a gate mask 120 may be sequentially formed on the gate insulation layer. The first conductive layer may be formed using polysilicon doped with impurities, and will be patterned to be provided as a gate electrode 115. In an embodiment of the present invention, the first conductive layer may be formed to have a multi-layered structure including a doped polysilicon layer and a metal silicide layer.

The first conductive layer and the gate insulation layer are sequentially patterned using the gate mask 120 as an etching mask. As a result, a gate structure 130 including a gate insulation pattern 110, the gate electrode 115 and the gate mask 120 is formed on the substrate 100. A gate spacer 125 may be formed on sidewalls of the gate structure 130.

An ion implantation process may be performed on the substrate 100 using the gate structure 130 and the gate spacer 125 as ion implantation masks to thereby implant impurities into upper portions of the substrate 100 between the gate structures 130. A thermal treatment process may be performed to form a first impurity region 135 and a second impurity region 140 corresponding to source/drain regions. The first impurity region 135 may correspond to a capacitor contact region making contact with a first contact pad, and the second impurity region 140 may correspond to a bit line contact region making contact with a second contact pad. As a result, a transistor including the gate structure 130, the gate spacer 125 and the first and the second impurity regions 135 and 140 is formed on the substrate 100.

The first insulation interlayer 145 is formed on the substrate 100 using silicon oxide to cover the transistor. The first insulation interlayer 145 may be formed using BPSG, phosphosilicate glass (PSG), spin-on-glass (SOG), HDP oxide, etc. In accordance with an example embodiment of the present invention, the insulation interlayer 145 may be formed using BPSG.

In an embodiment of the present invention, a chemical mechanical polishing (CMP) may be performed on the first insulation interlayer 145 to form the first insulation interlayer 145 having a flat upper face.

Figure 6:
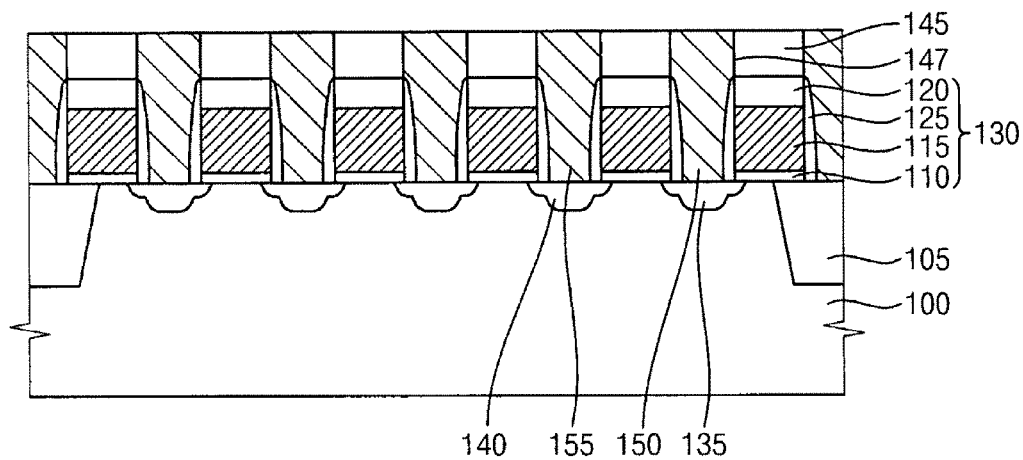

FIG. 6 is a cross-sectional view illustrating forming a first contact pad 150 and a second contact pad 155 in accordance with an example embodiment of the present invention.

Referring to FIG. 6, a second photoresist pattern (not shown) may be formed on the first insulation interlayer 145. Then, portions of the first insulation interlayer 145 exposed by the second photoresist pattern may be anisotropically etched to form first openings 147 through the first insulation interlayer 145. The first openings 147 expose the first and the second impurity regions 135 and 140. The first openings 147 may be formed by a self-alignment with respect to the gate structures 130.

Some of the first openings 147 expose the first impurity region 135 of a capacitor impurity region, and others of the first openings 147 expose the second impurity region 140 of the bit line impurity region. Then, a plasma ashing process and/or a cleaning process may be performed to remove the second photoresist pattern from the substrate 100.

A second conductive layer may be formed on the first insulation interlayer 145 to fill the first openings 147. The second conductive layer may be formed using the polysilicon doped with impurities, a metal or a conductive metal nitride. For example, the second conductive layer may be formed using polysilicon doped with impurities in accordance with an embodiment of the present invention.

A CMP process and/or an etch back process may be performed until an upper face of the first insulation interlayer 145 is exposed to form a first contact pad 150 and a second contact pad 155, both of which fill the first openings 147. The first contact pad 150 may be formed on the first impurity region 135, and the second contact pad 155 may be formed on the second impurity region 140. Therefore, the first contact pad 150 may be electrically connected to a capacitor, and the second contact pad 155 may be electrically connected to a bit line.

Figure 7:
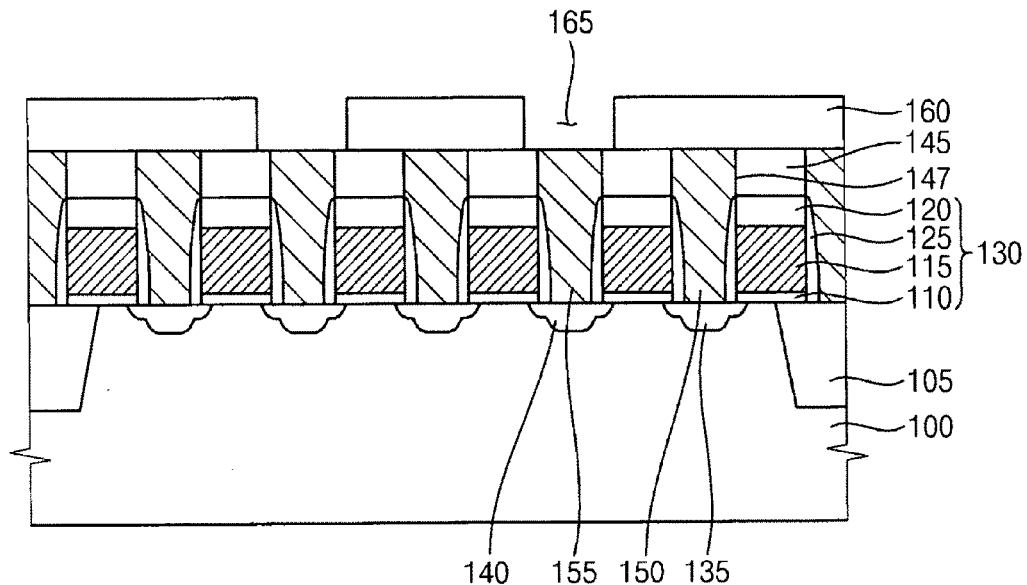

FIG. 7 is a cross-sectional view illustrating forming a second insulation interlayer 160 and a second opening 165.

Referring to FIG. 7, the second insulation interlayer 160 is formed on the first insulation interlayer 145 having the first contact pad 150 and the second contact pad 155. The second insulation interlayer 160 may electrically isolate the bit line formed in a subsequent process from the first contact pad 150 which is to be connected to the capacitor.

The second insulation interlayer 160 may be formed using BPSG, PSG, SOG or HDP oxide, etc. The second insulation interlayer 160 may be formed using BPSG in accordance with an embodiment of the present invention.

A CMP process may be performed on the second insulation interlayer 160 to form the second insulation interlayer 160 having a flat upper face. A third photoresist pattern (not shown) may be formed on the second insulation interlayer 160.

A portion of the second insulation interlayer 160 exposed by the third photoresist pattern may be etched to form a second opening 165 through the second insulation interlayer 160. The second opening 165 exposes the second contact pad 155. The second opening 165 may be a bit line contact hole. The bit line contact hole may eclectically connect the bit line formed in a subsequent process to the second contact pad 155. Then, a plasma ashing process and/or a cleaning process may be performed to remove the third photoresist pattern from the substrate 100.

Figure 8:
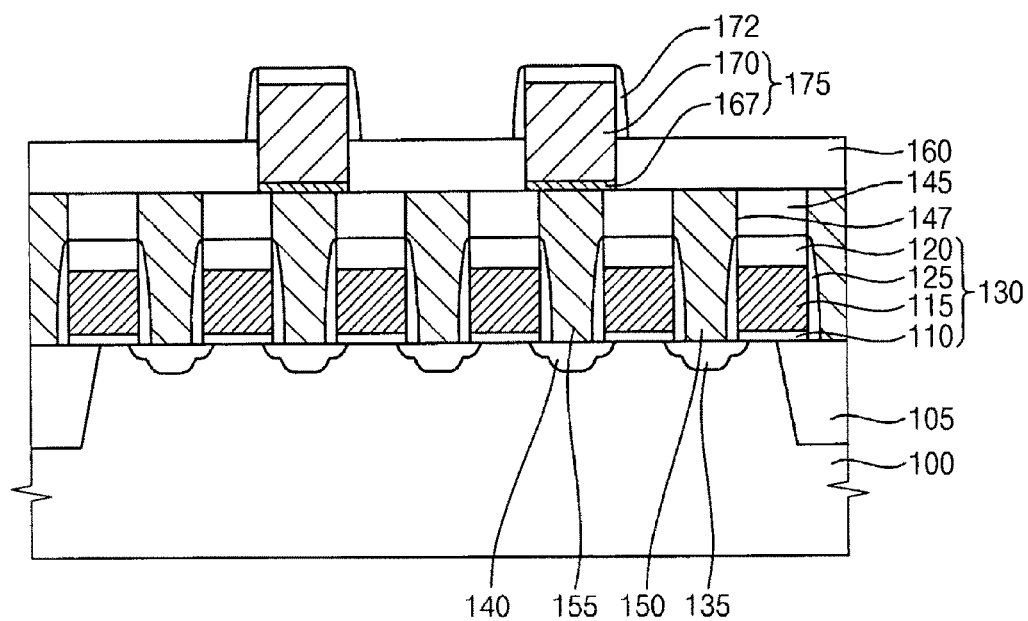

FIG. 8 is a cross-sectional view illustrating forming a conductive structure 175 and a bit line spacer.

Referring to FIG. 8, a third conductive layer is formed on the second insulation interlayer 160 to fill the second opening 165. The third conductive layer may be formed to have a multi-layered structure including a metal silicide layer and a metal layer.

After a hard mask is formed on the third conductive layer, the third conductive layer may be partially removed using the hard mask. As a result, the conductive structure 175 is formed on the second contact pad 155.

In accordance with an example embodiment of the present invention, the conductive structure 175 may include a first layer 167 and a second layer 170. The first layer 167 may be formed using a metal silicide, and the second layer 170 may be formed using a metal. Examples of the metal may include tungsten (W), tantalum (Ta), titanium (Ti), nickel (Ni), copper (Cu), aluminum (Al), etc. Examples of the metal silicide may include titanium silicide (TiSi$_x$), tantalum silicide (TaSi$_x$), nickel silicide (NiSi$_x$), copper silicide (CuSi$_x$), etc. Thereafter, a bit line spacer 172 may be formed on sidewalls of the conductive structure 175.

Figure 9:
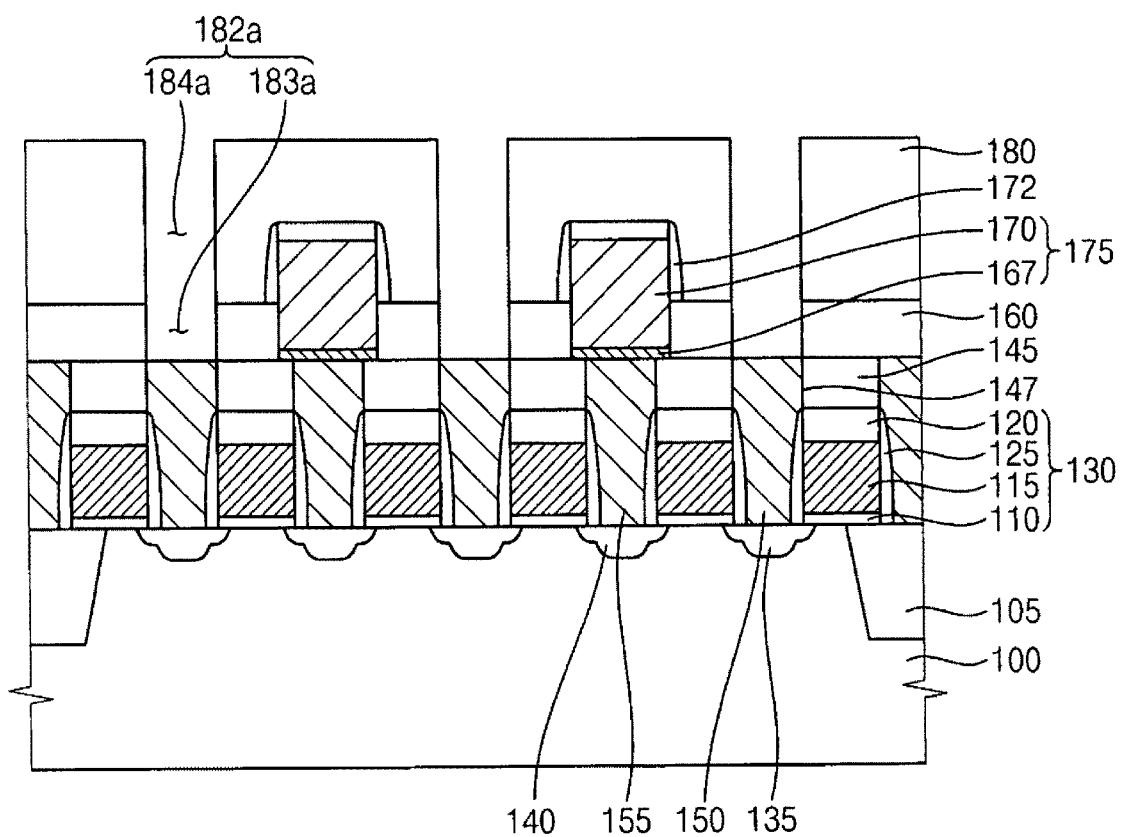

FIG. 9 is a cross-sectional view illustrating forming a third insulation interlayer 180 and a preliminary contact hole 182a.

Referring to FIG. 9, the third insulation interlayer 180 is formed on the second insulation interlayer 160 to cover the conductive structure 175. The third insulation interlayer 180 may have an etching selectivity substantially lower than that of the second insulation interlayer 160. The third insulation interlayer 180 may be formed using HDP silicon oxide in accordance with an embodiment of the present invention. Additionally, a planarization process may be performed to form the third insulation interlayer 180 having a flat upper face.

A fourth photoresist pattern (not shown) may be formed on the third insulation interlayer 180. Then, the third insulation interlayer 180 and the second insulation interlayer 160 may be sequentially etched by using the fourth photoresist pattern as an etching mask. As a result, a preliminary contact hole 182a is formed through the third insulation interlayer 180 and the second insulation interlayer 160. The preliminary contact hole 182a may expose the first contact pad 150 with a first width.

The preliminary contact hole 182a includes a first preliminary contact hole 184a and a second preliminary contact hole 183a. The first preliminary contact hole 184a penetrates the third insulation interlayer 180, and the second preliminary contact hole 183a penetrates the second insulation interlayer 160. A lower width of the first preliminary contact hole 184a may be substantially greater than that of the second preliminary contact hole 183a.

The preliminary contact hole 182a may be employed in manufacturing a semiconductor device having a design rule of about 90 nm or less. However, a small exposed area of the first contact pad 150 may cause a reduction of an electrical conductivity at an interface between a contact plug 190 (see FIG. 11) for a capacitor and the first contact pad 150. Therefore, the width of the preliminary contact hole 182a may be advantageously enlarged.

Figure 10:
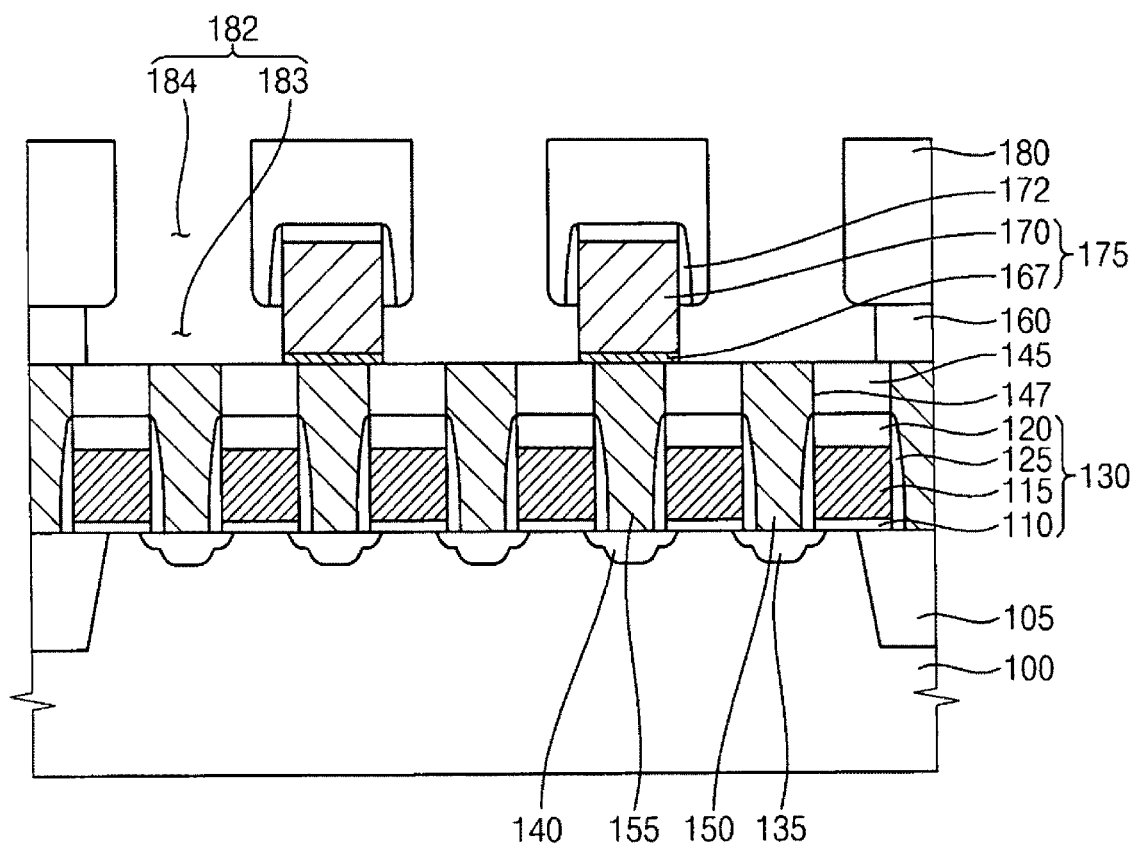

FIG. 10 is a cross-sectional view illustrating forming a contact hole 182 in accordance with an embodiment of the present invention.

Referring to FIG. 10, portions of the third insulation interlayer 180 and the second insulation interlayer 160 exposed by the preliminary contact hole 182a may be etched using a composition for etching silicon oxide in accordance with the present invention. As a result, the contact hole 182 having a second width may be formed through the third insulation interlayer 180 and the second insulation interlayer 160. The second width of the contact hole 182 may be substantially wider than the first width of the preliminary contact hole 182a. The preliminary contact hole 182a may be converted into the contact hole 182 that exposes the first contact pad 150 with the second width that is substantially wider than the first width. In accordance with an example embodiment of the present invention, the contact hole 182 may include a first contact hole 184 formed through the HDP silicon oxide layer 180 and a second contact hole 183 formed through the BPSG layer 160.

In an embodiment of the present invention, the contact hole 182 may be formed by partially etching the second insulation interlayer 160 until a sidewall of the metal silicide pattern 167 is exposed. Although the metal silicide pattern 167 is exposed by the second contact hole 183, the metal silicide pattern will not be substantially damaged by the composition for etching silicon oxide.

In accordance with an embodiment of present invention, the composition for etching silicon oxide includes from about 0.01 to about 2 percent by weight of ammonium bifluoride (NH$_4$HF$_2$), from about 2 to about 35 percent by weight of an organic acid, from about 0.05 to about 1 percent by weight of an inorganic acid, and a remainder of a low polar organic solvent.

Examples of the organic acid may include acetic acid, formic acid, propionic acid, etc. These may be used alone or in a mixture thereof.

Examples of the inorganic acid may include hydrochloric acid (HCl), nitric acid (HNO$_3$), sulfuric acid (H$_2$SO$_4$), etc. These may be used alone or in a mixture thereof. In accordance with an embodiment of the present invention, nitric acid may be used for the inorganic acid.

Examples of the low polar organic solvent include dimethylformamide, dimethyl sulfoxide, acetonitrile, tetrahydrofuran, methyl ethyl ketone, etc. These may be used alone or in a mixture thereof. In accordance with an embodiment of the present invention, acetonitrile may be used for the low polar organic solvent.

Figure 11:
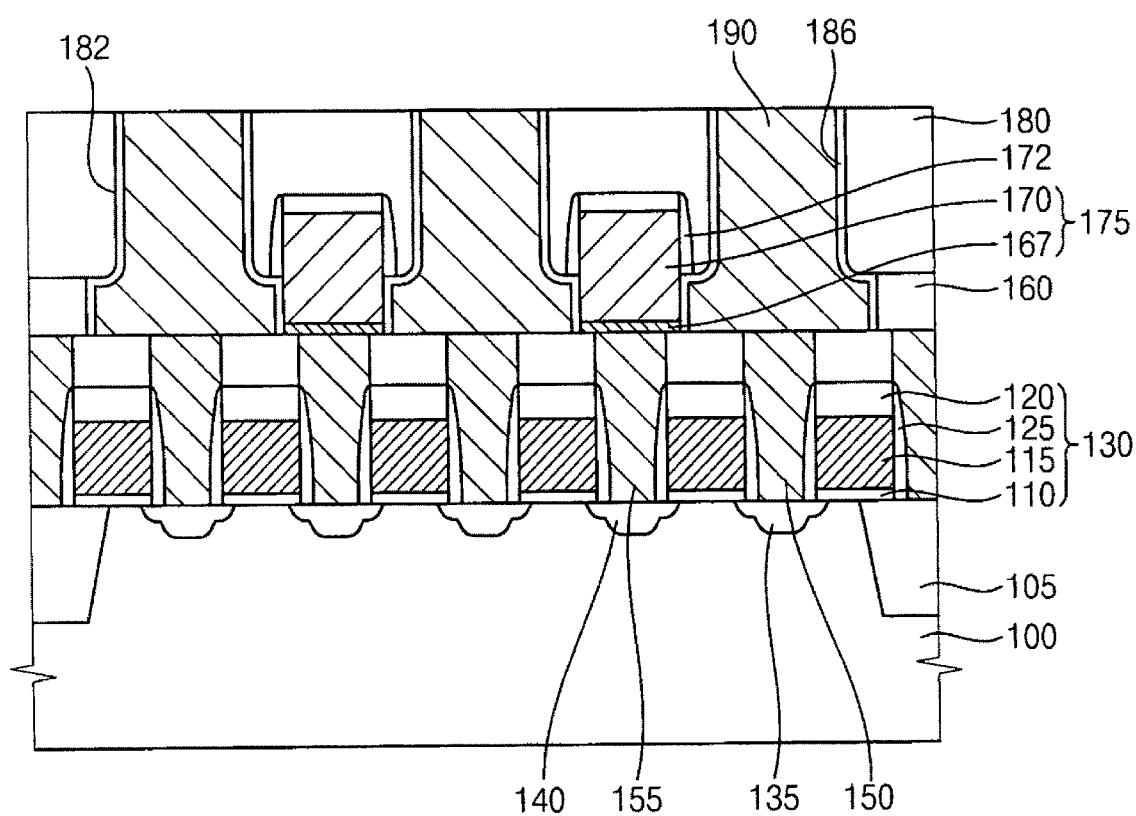

FIG. 11 is a cross-sectional view illustrating forming an insulation spacer 186 and a contact plug 190 in accordance with an embodiment of the present invention.

Referring to FIG. 11, the insulation spacer 186 is formed on a sidewall of the contact hole 182, and then a fourth conductive layer is formed to fill the contact hole 182. The fourth conductive layer may be partially removed by a CMP process until an upper face of the third insulation interlayer 180 is exposed. As a result, the contact plug 190 is formed to fill the contact hole 182. The contact plug 190 may be formed using polysilicon doped with an impurity. The contact plug 190 and the first contact pad 150 may electrically connect a lower electrode 220 (see FIG. 13), formed in a subsequent process, to the second impurity region 140. Herein, the insulation spacer 186 may electrically isolate the conductive structure 175 from the contact plug 190.

Figure 12:
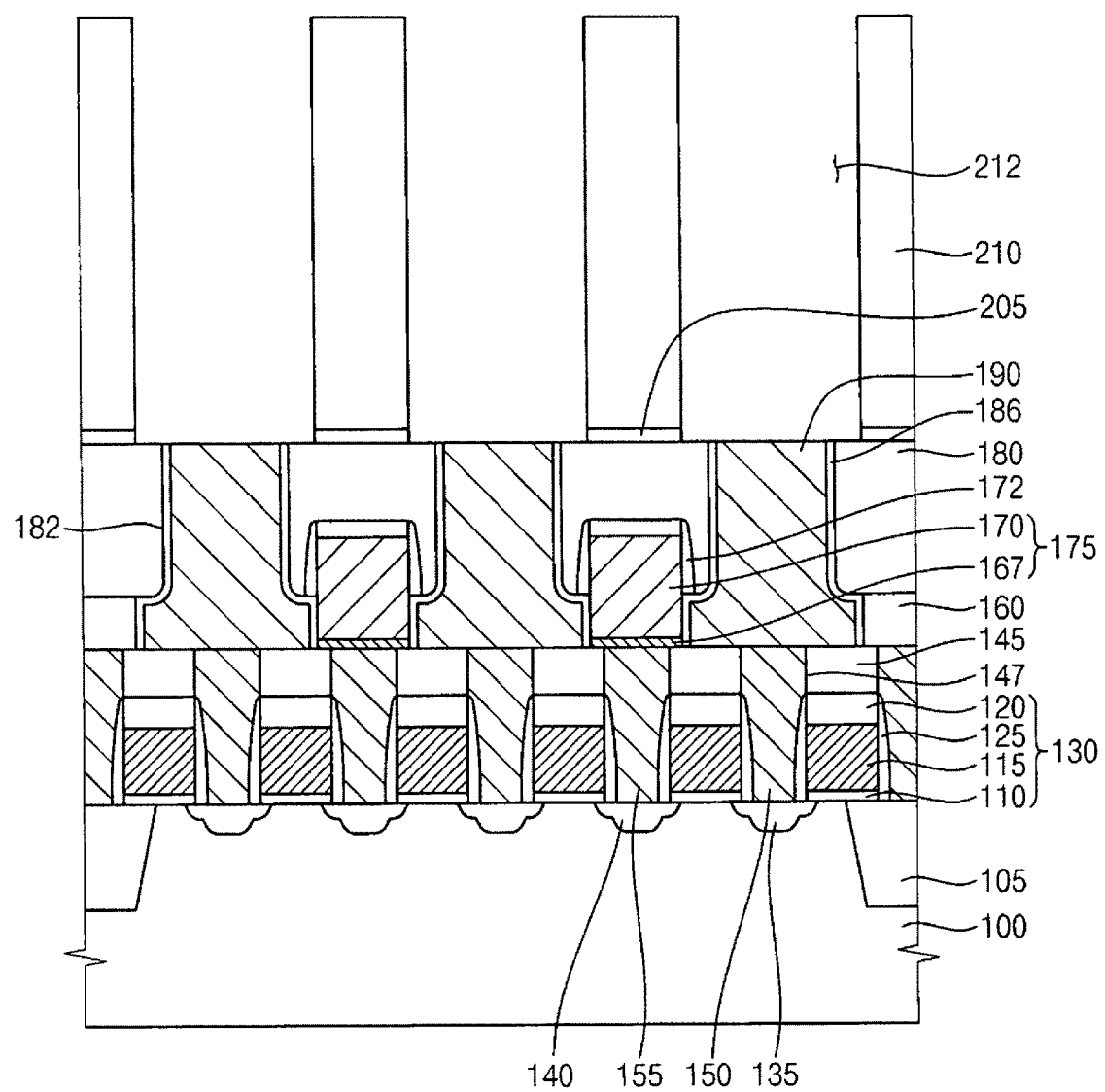

FIG. 12 is a cross-sectional view illustrating forming an etching stop layer 205 and a mold layer pattern 210 in accordance with an embodiment of the present invention.

Referring to FIG. 12, the etching stop layer 205 is formed on the contact plug 190 and the third insulation interlayer 180. For example, the etching stop layer 205 may prevent the contact plug 190 from being damaged, while the mold layer pattern 210 is formed in a subsequent process. The etching stop layer 205 may be formed to have a thickness of from about 10 to about 200 Å. The etching stop layer 205 may be formed using a nitride or a metal oxide having a low etching rate relative to a mold layer.

A mold layer is formed on the etching stop layer 205. The mold layer may be formed using an oxide such as BPSG, PSG, undoped silicate glass (USG), SOG, a plasma-enhanced tetraethyl orthosilicate (PE-TEOS), etc. A thickness of the mold layer may be adjusted according to the capacitance required in the capacitor.

After a mask (not shown) is formed on the mold layer, the mold layer exposed by the mask may be selectively etched anisotropically to form a third opening 212 through the mold layer. The third opening 212 may partially expose the etching stop layer 205. Then, a portion of the etching stop layer 205 exposed by the third opening 212 may be selectively removed from the contact plug 190 and the third insulation interlayer 180. The mold layer may be converted into the mold layer pattern 210 by forming the third opening 212.

Figure 13:
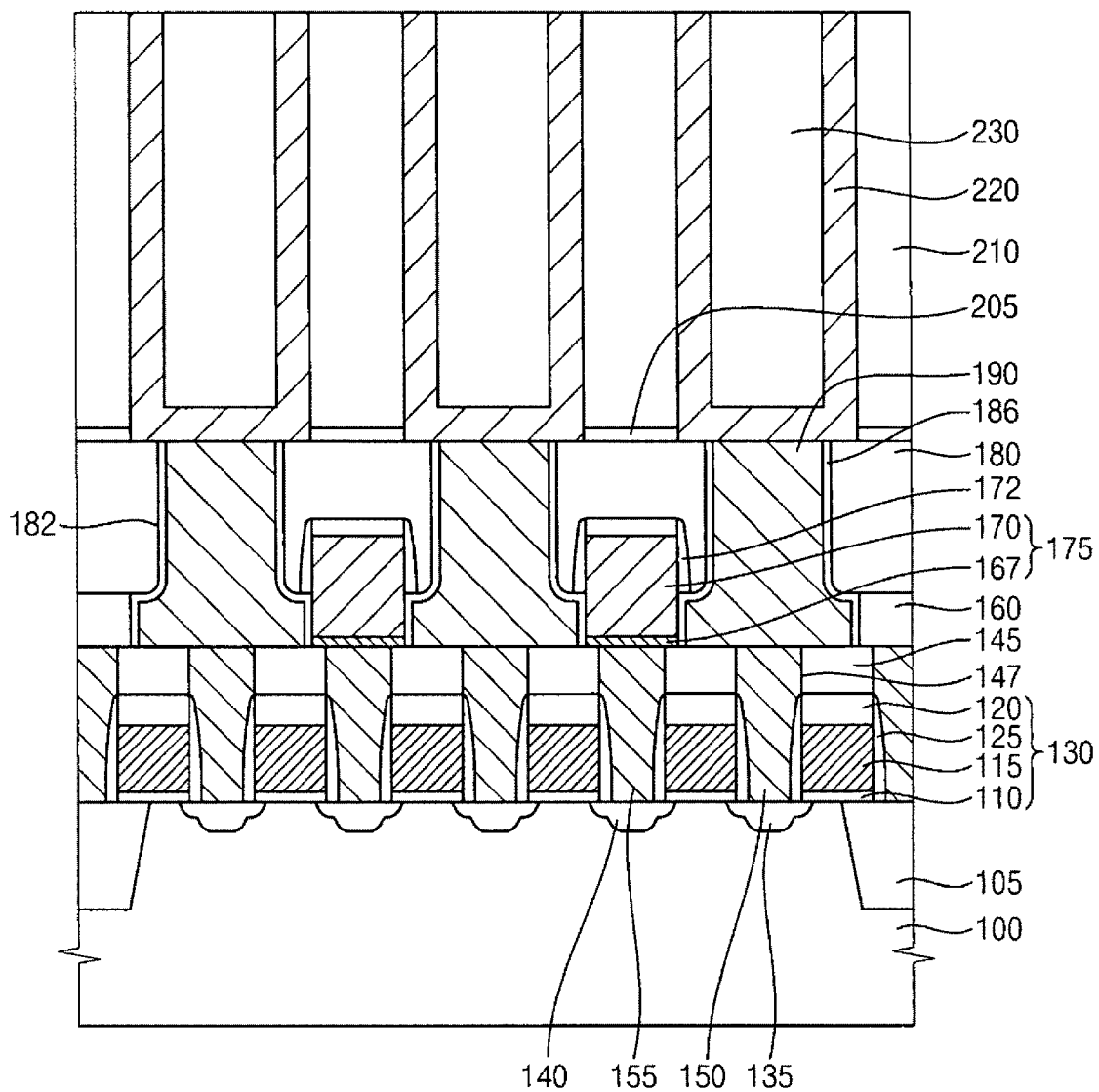

FIG. 13 is a cross-sectional view illustrating forming a lower electrode 220 and a sacrificial layer pattern 230 in accordance with an embodiment of the present invention.

Referring to FIG. 13, a lower electrode layer may be continuously formed on sidewalls and a bottom of the third opening 212 and an upper face of the mask. The lower electrode layer may be formed to have a uniform thickness. The lower electrode layer may be formed using a conductive material such as tungsten, titanium, tungsten nitride, titanium nitride, etc.

A sacrificial layer is formed on the lower electrode layer to fill the third opening 212. For example, the sacrificial layer may be formed using an oxide or a photoresist composition.

The sacrificial layer may be partially removed by a CMP process until an upper face of the mold layer pattern is exposed. As a result, the lower electrode 220 having a cylindrical shape may be formed, and the sacrificial layer pattern 230 may be formed to fill the third opening 212.

Figure 14:
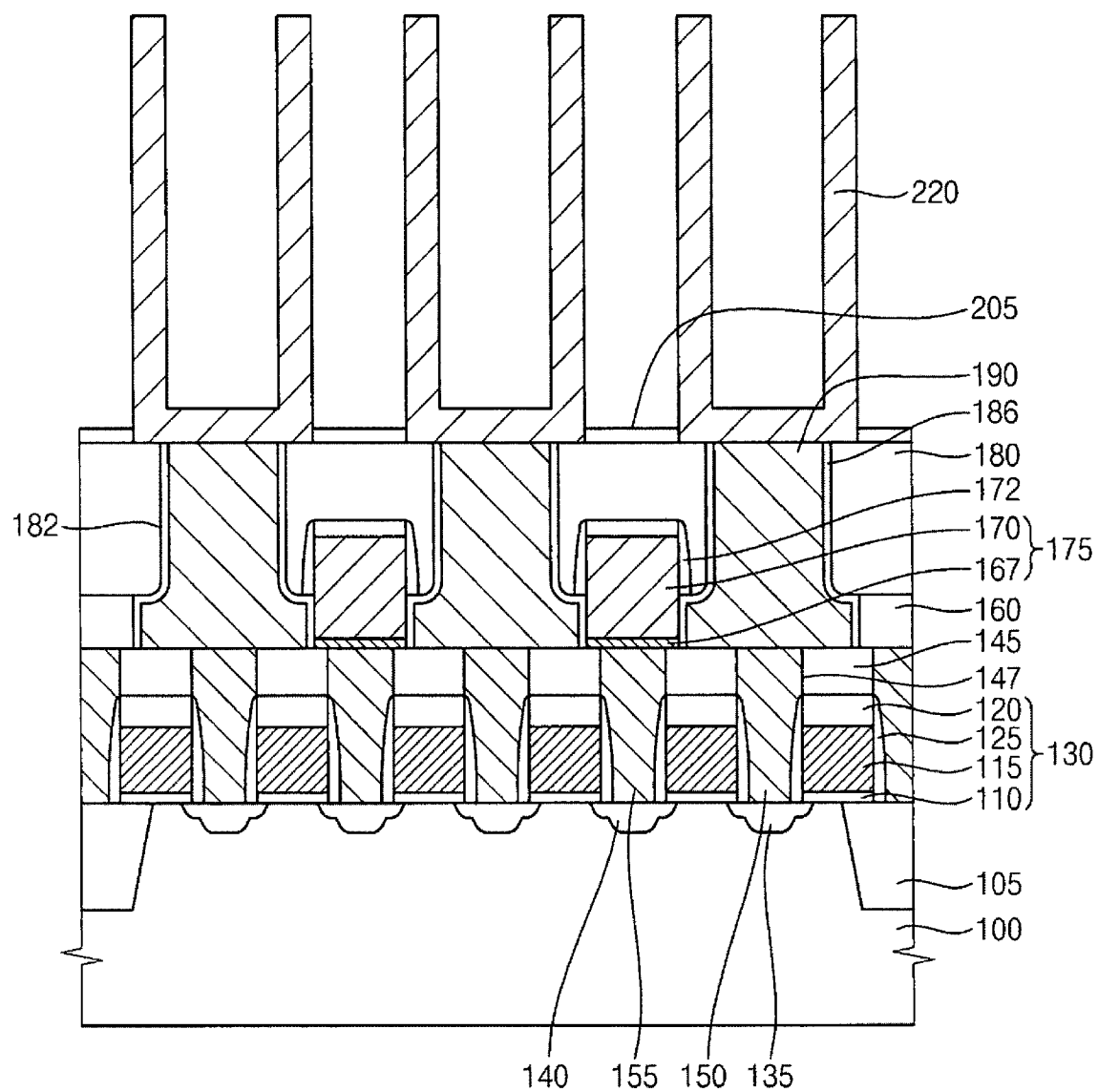

FIG. 14 is a cross-sectional view illustrating removing the sacrificial layer pattern 230 and the mold layer pattern 210 from the substrate 100 in accordance with an embodiment of the present invention.

Referring to FIG. 14, the mold layer pattern 210 may be removed from the substrate 100 using an LAL etching solution. Then, the sacrificial layer pattern 230 may be removed from the lower electrode 220. As a result, the lower electrode 220 having a cylindrical shape and making contact with the contact plug 190 may be exposed.

Figure 15:
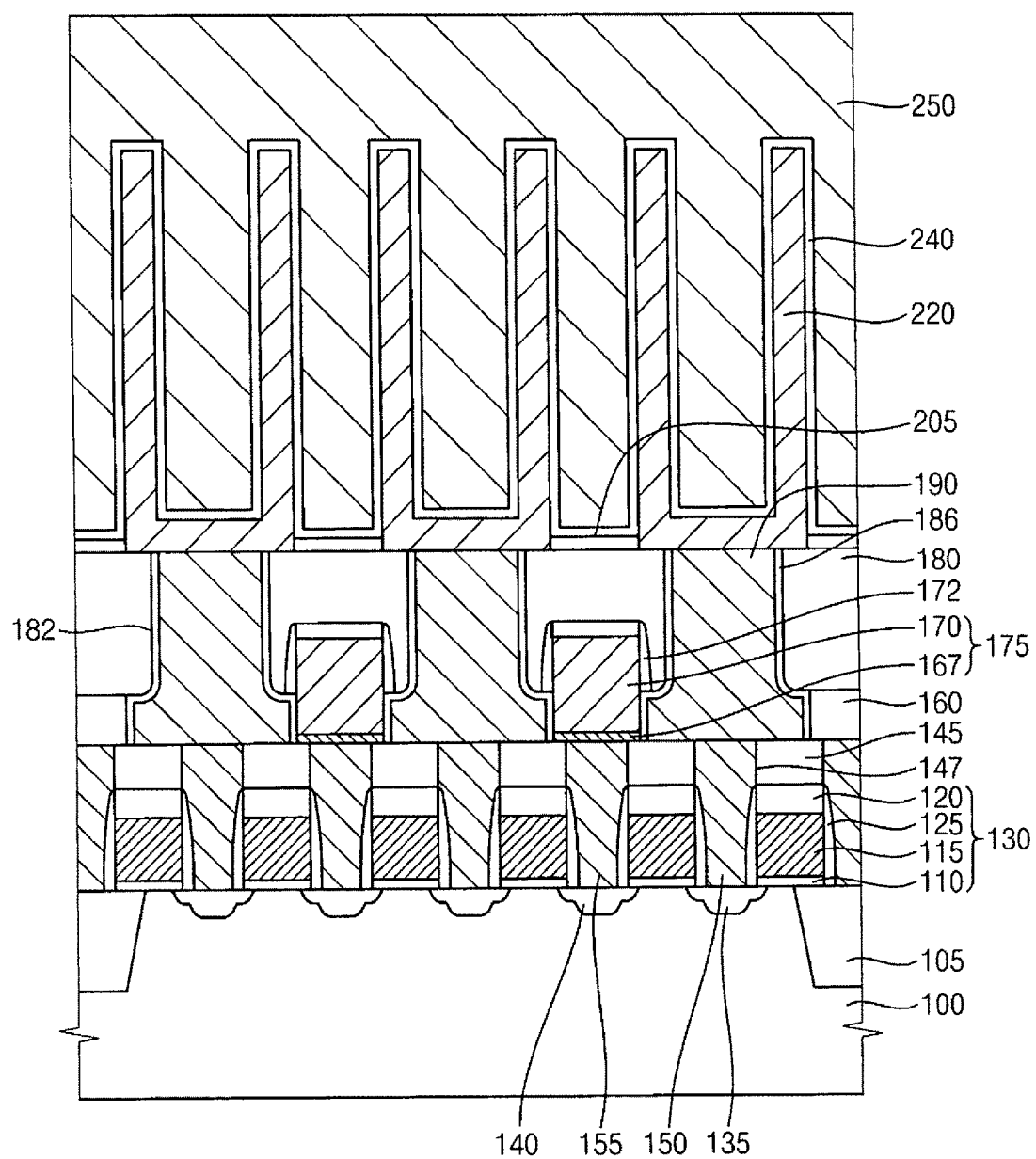

FIG. 15 is a cross-sectional view illustrating forming a dielectric layer 240 and an upper electrode 250 in accordance with an embodiment of the present invention.

Referring to FIG. 15, the dielectric layer 240 having a substantially uniform thickness may be formed on the lower electrode 220.

Particularly, the dielectric layer 240 may be formed using an oxide, a nitride or a metal oxide, etc. In an embodiment of the present invention, the dielectric layer 240 may be formed to have a multi-layered structure that includes an oxide/nitride structure or an oxide/nitride/oxide structure. The dielectric layer 240 may be advantageously formed using a metal oxide, because the metal oxide may have a greatly reduced equivalent oxide thickness (EOT) and an enhanced leakage current property.

In an embodiment of the present invention, the dielectric layer 240 may be formed by an ALD process that is performed at least once by sequentially supplying a reactant, a purge gas, an oxidant agent and a purge gas. For example, the dielectric layer 240 may be formed by depositing a metal oxide employing the ALD process.

After forming the dielectric layer 240, the upper electrode 250 is formed on the dielectric layer 240. The upper electrode 250 may be formed using doped polysilicon, a metal, a metal nitride, etc. In an embodiment of the present invention, the upper electrode 250 and the lower electrode 220 may be formed using the same type of a conductive material. The upper electrode 250 may be formed using metal nitride so as to enhance the degree of integration of a semiconductor device. For example, the upper electrode 250 may be formed by depositing titanium nitride through a CVD process.

A capacitor may be formed on the substrate 100 by sequentially forming the lower electrode 220, the dielectric layer 240 and the upper electrode 250. Accordingly, the capacitor may include the lower electrode 220 having a cylindrical shape, and thus may have an enhanced electrical capacitance.

The present invention will be further described through Examples and Comparative Examples, hereinafter. Examples and Comparative Examples are illustrative of the present invention and are not to be construed as limiting thereof.

Preparation of a Composition for Etching Silicon Oxide

Example 1

A composition for etching silicon oxide was prepared by mixing about 0.1 percent by weight of ammonium bifluoride, about 20 percent by weight of acetic acid as an organic acid, about 0.1 percent by weight of nitric acid as an inorganic acid and a remainder of acetonitrile as a low polar organic solvent based on a total weight of the composition.

Example 2

A composition for etching silicon oxide was prepared by mixing about 0.2 percent by weight of ammonium bifluoride, about 20 percent by weight as acetic acid of an organic acid, about 0.1 percent by weight of nitric acid as an inorganic acid and a remainder of acetonitrile as a low polar organic solvent based on a total weight of the composition.

Example 3

A composition for etching silicon oxide was prepared by mixing about 0.3 percent by weight of ammonium bifluoride, about 20 percent by weight of acetic acid as an organic acid, about 0.1 percent by weight of nitric acid as an inorganic acid and a remainder of acetonitrile as a low polar organic solvent based on a total weight of the composition.

Example 4

A composition for etching silicon oxide was prepared by mixing about 0.5 percent by weight of ammonium bifluoride, about 20 percent by weight of acetic acid as an organic acid, about 0.1 percent by weight of nitric acid as an inorganic acid and a remainder of acetonitrile as a low polar organic solvent based on a total weight of the composition.

Example 5

A composition for etching silicon oxide was prepared by mixing about 0.7 percent by weight of ammonium bifluoride, about 20 percent by weight of acetic acid as an organic acid, about 0.1 percent by weight of nitric acid as an inorganic acid and a remainder of acetonitrile as a low polar organic solvent based on a total weight of the composition.

Example 6

A composition for etching silicon oxide was prepared by mixing about 0.1 percent by weight of ammonium bifluoride, about 10 percent by weight of acetic acid as an organic acid, about 0.1 percent by weight of nitric acid as an inorganic acid and a remainder of acetonitrile as a low polar organic solvent based on a total weight of the composition.

Example 7

A composition for etching silicon oxide was prepared by mixing about 0.1 percent by weight of ammonium bifluoride, about 30 percent by weight of acetic acid as an organic acid, about 0.1 percent by weight of nitric acid as an inorganic acid and a remainder of acetonitrile as a low polar organic solvent based on a total weight of the composition.

Comparative Example 1

An LAL 200 solution was prepared by mixing about 0.7 percent by weight of hydrofluoric acid (HF), about 17 percent by weight of ammonium fluoride ($NH_4F$) based on a total weight of the solution and a remainder of water.

Comparative Example 2

A composition was prepared by mixing about 0.5 percent by weight of hydrofluoric acid (HF) and a remainder of water.

Evaluation 1

Etching rates of a BPSG layer and an HDP silicon oxide layer were measured for the compositions prepared in Examples 1 to 5, and etching selectivities of the BPSG layer over the HDP silicon oxide layer (BPSG/HDP) were evaluated. The results are shown in FIG. 16.

Figure 16:
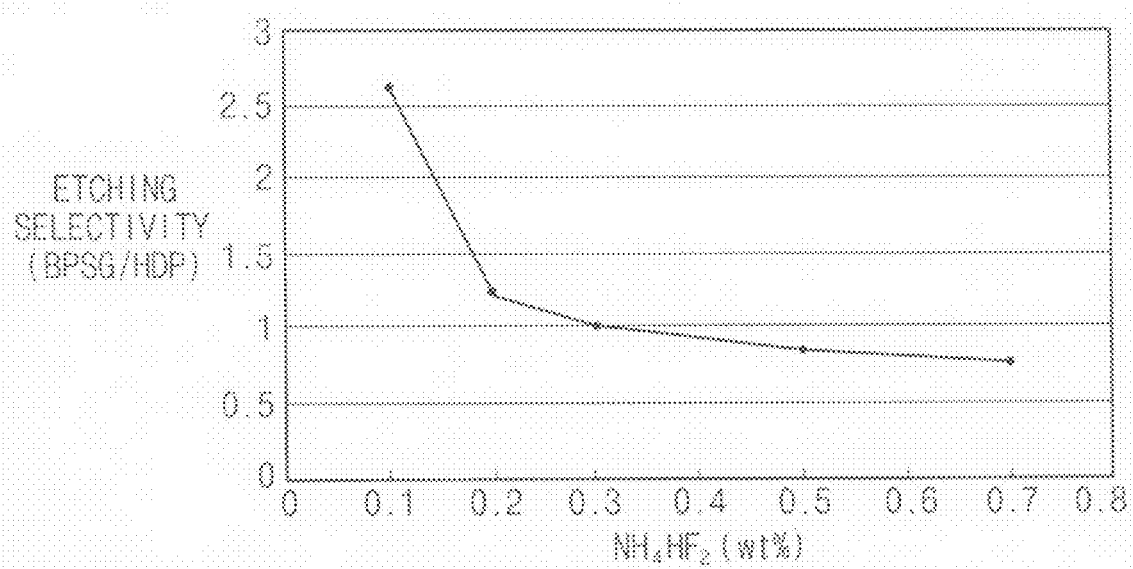
FIG. 16 is a graph showing the change of etching selectivity between an HDP silicon oxide layer and a BPSG layer according to the amount of change of ammonium bifluoride included in the composition for etching silicon oxide.

FIG. 16 is a graph showing a change of an etching selectivity between an HDP silicon oxide layer and a BPSG layer according to an amount change of ammonium bifluoride included in the composition for etching silicon oxide.

Referring to FIG. 16, as the amount of ammonium bifluoride included in the compositions of Examples 1 to 5 was increased, the etching selectivity of the BPSG layer over the HDP silicon oxide layer was reduced. Accordingly, it may be noted that the etching selectivity of the BPSG layer over the HDP silicon oxide layer may be adjusted by changing the amount of ammonium bifluoride.

Evaluation 2

Etching rates and etching selectivities of HDP silicon oxide layer and a BPSG layer were evaluated for the compositions prepared in Examples 1, 6 and 7. The results are shown in Table 1.

TABLE 1

| | | Example 6 | Example 1 | Example 7 |
|---|---|---|---|---|
| Etching Rate [Å/min] | BPSG | 24 | 21 | 18 |
| | HDP | 19 | 9 | 7 |
| Etching Selectivity (HDP:BPSG) | | 1:1.3 | 1:2.3 | 1:3.3 |

As shown in Table 1, the etching selectivity between the HDP silicon oxide layer and the BPSG layer was changed in accordance with a variation in the amount of the organic acid. Particularly, as the amount of acetic acid included in the composition was increased, the etching selectivity between the HDP silicon oxide layer and the BPSG layer was also enhanced. Accordingly, it may be confirmed that the etching selectivity between the HDP silicon oxide layer and the BPSG layer may be controlled by changing the amount of the organic acid.

Evaluation 3

In order to evaluate the degree of damage to titanium silicide, a sample including a titanium silicide pattern and a silicon oxide layer was prepared. The silicon oxide layer had a contact hole that exposed a sidewall of the titanium silicide pattern. The silicon oxide layer was prepared by sequentially forming a BPSG layer and an HDP silicon oxide layer. The BPSG layer had a thickness of about 129 nm, and the HDP silicon oxide layer had a thickness of about 397 nm. Subsequently, the sample was treated with the composition prepared in Comparative Example 1 for about 40 seconds, and then was treated with the composition prepared in Comparative Example 2 for about 90 seconds so as to enlarge the contact hole. The degree of damage to the titanium silicide pattern was observed using a vertical scanning electron microscope (VSEM). The result is shown in FIG. 17.

Figure 17:
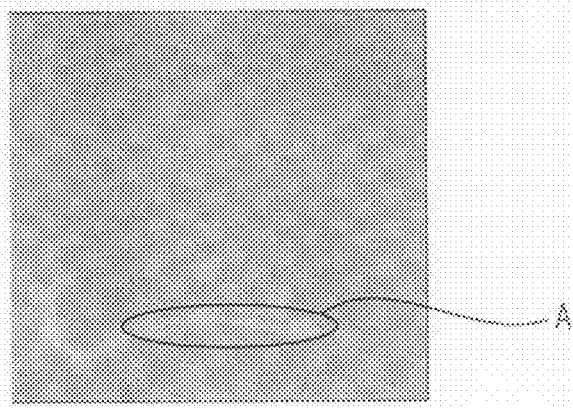
FIG. 17 is a VSEM picture showing the degree of damage to a titanium silicide pattern while a contact hole is enlarged using compositions prepared in Comparative Examples 1 and 2.

FIG. 17 is a VSEM picture showing a degree of damage to the titanium silicide pattern while the contact hole was enlarged using the compositions prepared in Comparative Examples 1 and 2.

Referring to FIG. 17, while the contact hole was enlarged, about 56 nm of the BPSG layer and about 47 nm of the HDP silicon oxide layer were etched. Further, about 400 nm of the titanium silicide pattern was damaged as shown in a portion "A" in FIG. 17. It may be noted that the compositions of Comparative Examples may generate an excessive amount of damage to the metal silicide pattern.

Evaluation 4

In order to evaluate the degree of damage to titanium silicide, a sample including a titanium silicide pattern and a silicon oxide layer was prepared. The silicon oxide layer had a contact hole that exposed a sidewall of the titanium silicide pattern. The silicon oxide layer was prepared by sequentially forming a BPSG layer and an HDP silicon oxide layer. The BPSG layer had a thickness of about 129 nm, and the HDP silicon oxide layer had a thickness of about 397 nm. Subsequently, the sample was treated with the composition prepared in Example 1 for about 160 seconds so as to enlarge the contact hole. The degree of damage to the titanium silicide pattern was observed using a VSEM. The result is shown in FIG. 18.

Figure 18:
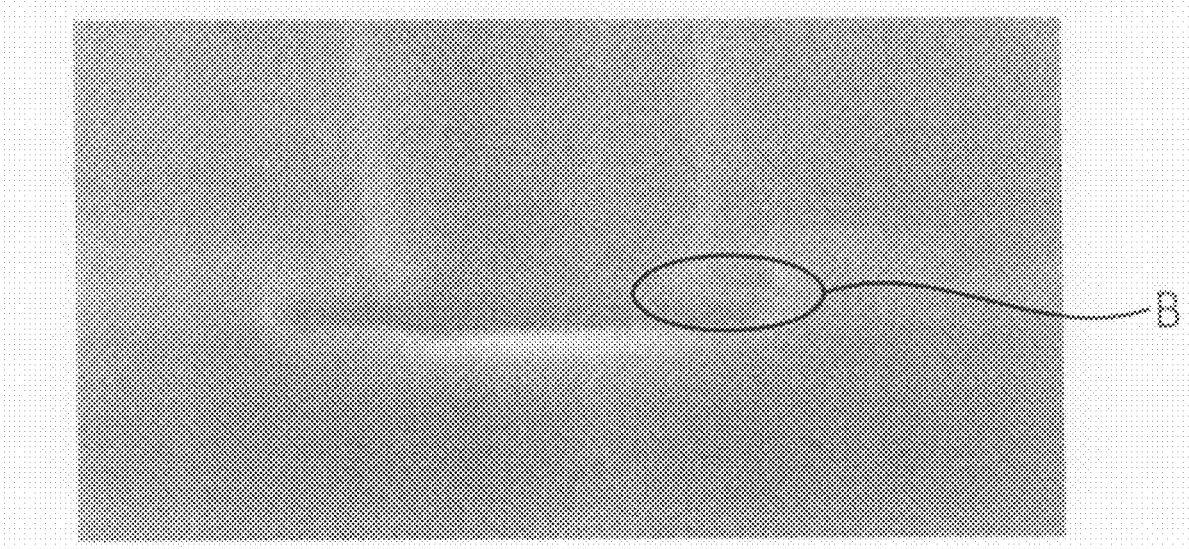
FIG. 18 is a VSEM picture showing the degree of damage to a titanium silicide pattern while a contact hole is enlarged using a composition prepared in Example 1.

FIG. 18 is a VSEM picture showing the degree of damage to the titanium silicide pattern while a contact hole is enlarged using the composition prepared in Example 1.

Referring to FIG. 18, the BPSG layer was laterally etched by about 62 nm, and the HDP silicon oxide layer was laterally etched by about 46 nm. The titanium silicide pattern was laterally damaged by about 40 nm or less as shown in a portion "B" in FIG. 18. It may be noted that the composition prepared in Example 1 may suppress or prevent the titanium silicide pattern from being damaged about ten times more effectively than the composition prepared in Comparative Examples.

According to an example embodiment of the present invention, the composition for etching silicon oxide may be used for enlarging a width of a contact hole formed in a silicon oxide layer, and may also reduce damages to a metal silicide pattern that may be exposed during the process for forming the contact hole. Additionally, the composition may have an improved etching selectivity between a HDP silicon oxide layer and a BPSG layer.

The composition may suppress damages to the metal silicide pattern of a conductive structure, and thus a spacer may be properly formed on a sidewall of the conductive structure exposed by the contact hole, and an increase of an electrical resistance in the conductive structure may be reduced or eliminated.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a contact hole comprising:
preparing a substrate having a silicon oxide layer that covers conductive structures including a metal silicide pattern;
performing a first etching process on the silicon oxide layer to form a preliminary contact hole that exposes the substrate between the conductive structures with a first width; and
performing a second etching process on the silicon oxide layer using a composition to form a silicon oxide layer pattern having a contact hole that exposes the substrate between the conductive structures with a second width substantially greater than the first width, the composition including from about 0.01 to about 2 percent by weight of ammonium bifluoride ($NH_4HF_2$), from about 2 to about 35 percent by weight of an organic acid, from about 0.05 to about 1 percent by weight of an inorganic acid, and a remainder of a polar organic solvent.

2. The method of claim 1, wherein the silicon oxide layer is formed to have a multi-layered structure sequentially including a BPSG layer and an HDP silicon oxide layer.

3. The method of claim 2, wherein a thickness ratio between the BPSG layer and the HDP silicon oxide layer is in a range of from about 1:2 to about 1:4.

4. The method of claim 2, wherein the contact hole comprises a first contact hole having a first lower width formed through the HDP silicon oxide layer and a second contact hole having a second lower width formed through the BPSG layer, the second lower width being substantially greater than the first lower width.

5. The method of claim 2, wherein the composition has an etching selectivity between the HDP silicon oxide layer and the BPSG layer in a range of from about 1:1.2 to about 1:2.5.

6. The method of claim 1, wherein the second etching process is performed on the silicon oxide layer until a sidewall of the metal silicide pattern is exposed.

7. The method of claim 1, wherein the substrate comprises a transistor including a first impurity region and a second impurity region, a first contact pad connected to the first impurity region and a second contact pad connected to the second impurity region.

8. The method of claim 1, wherein the inorganic acid comprises at least one of hydrochloric acid (HCl), nitric acid ($HNO_3$) and sulfuric acid ($H_2SO_4$).

9. The method of claim 1, wherein the organic acid comprises at least one of acetic acid, formic acid and propionic acid.

10. The method of claim 1, wherein the polar organic solvent comprises at least one of dimethylformamide, dimethyl sulfoxide, acetonitrile, tetrahydrofuran and methyl ethyl ketone.

11. The method of claim 1, wherein the composition comprising:
from about 0.05 to about 1 percent by weight of ammonium bifluoride;
from about 5 to about 30 percent by weight of the organic acid;
from about 0.06 to about 0.5 percent by weight of the inorganic acid; and
the remainder being the polar organic solvent.

12. The method of claim 1, wherein the composition comprising:
from about 0.1 to about 0.5 percent by weight of ammonium bifluoride;
from about 10 to about 25 percent by weight of the organic acid;
from about 0.08 to about 0.3 percent by weight of the inorganic acid; and
the remainder being the polar organic solvent.

* * * * *